United States Patent
Arz et al.

(10) Patent No.: US 6,236,209 B1
(45) Date of Patent: May 22, 2001

(54) ACTIVELY SHIELDED, TRANSVERSAL GRADIENT COIL SYSTEM WITH 3D CONNECTION TECHNOLOGY

(75) Inventors: Winfried Arz, Erlangen; Johann Schuster, Oberasbach, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/429,173

(22) Filed: Oct. 28, 1999

(30) Foreign Application Priority Data

Oct. 28, 1999 (DE) .............................................. 198 49 731

(51) Int. Cl.$^7$ ....................................................... G01V 3/00
(52) U.S. Cl. ............................................ 324/318; 324/309
(58) Field of Search ..................................... 324/318, 309, 324/322

(56) References Cited

U.S. PATENT DOCUMENTS 4,724,412 * 2/1988 Kalafala ................................. 335/299
5,512,828 * 4/1996 Pausch et al. ........................ 324/309

* cited by examiner

Primary Examiner—Christine Oda
Assistant Examiner—Brij B. Shrivastav
(74) Attorney, Agent, or Firm—Schiff Hardin & Waite

(57) ABSTRACT

Actively shielded, transversal gradient coil system for a nuclear magnetic resonance tomography apparatus, wherein the windings of the coils implemented in 3D technology include a plurality of open conductor ends, and wherein the connector elements for conductor ends discharging between the center planes of neighboring shim pockets are planar plate connectors arranged in a plurality of planes, insulated from one another, that respectively include a base part secured to a carrier ring and lying completely outside the shim pocket and include conductor fastening legs projecting substantially radially outward therefrom that are arranged circumferentially offset relative to one another in the planes lying above one another.

10 Claims, 10 Drawing Sheets

ACTIVELY SHIELDED, TRANSVERSAL GRADIENT COIL SYSTEM WITH 3D CONNECTION TECHNOLOGY

BACKGROUND OF THE INVENTION

1. Field of the Invention

The present invention is directed to an actively shielded, transversal gradient coil system for a nuclear magnetic resonance tomography apparatus, wherein saddle coils are provided in both primary and secondary planes for generating respective gradient fields for the X-direction and the Y-direction. These coils include a radial spacing, and the windings of the coils implemented in 3D technology include a plurality of open conductor ends wherein the contact between the conductor ends of the primary and secondary planes belonging to one another occurs via connector elements at an end face.

2. Description of the Prior Art

In contrast to the conventional, or through-wound, design of tesseral gradient coils, the 3D version includes a plurality of open conductor ends. Specific connector elements thereby produce the contact between a conductor loop of the primary plane with a winding of the secondary plane.

U.S. Letters Pat. No. 5,349,318, for example, discloses a gradient coil arrangement, wherein conductors of the gradient coil are essentially arranged in a primary plane, which is an inner cylindrical envelope, and in a secondary plane, which is an outer cylindrical envelope that concentrically surrounds the inner cylindrical envelope. At each of the two cylindrical envelopes, the conductor arrangement thereby contains a helical conductor section as well as a plurality of horseshoe-shaped conductor sections. At one end face of the cylindrical envelopes, the open conductor ends of the conductor sections between the two cylindrical envelopes are connected to one another via conductive connector wires. Pursuant to such configuration, the connector wires, for example, are soldered to the conductor ends.

With other gradient coils implemented in 3D technology, soldered pins are employed as connector elements which produce the connection between conductor ends that are formed as plates of sheet copper cut with a water jet. This type of connection, however, is actually more suitable for plane-parallel conductor structures. For curved surfaces, and given constricted space conditions, such pin connections hardly can be employed.

The present invention is therefore based on the object of creating a connection technology for the conductor loops of the primary and secondary planes that is simple and that can be applied for all conceivable applications of gradient coils in 3D technology.

SUMMARY OF THE INVENTION

For achieving this object, the present invention provides that the connector elements for conductor ends discharging between the center planes of neighboring shim pockets are planar plate connectors arranged in a plurality of planes insulated from one another. These plate connectors respectively include a base part secured to a carrier ring and lie completely outside the shim pocket and conductor fastening legs projecting substantially radially outward therefrom that are arranged offset circumferentially relative to one another in the planes lying above one another.

All of the demands made of the connector elements of gradient coils in 3D technology can be met by the inventive multi-layer connecting technology, even when these cover partially contradictory demands. Due to the insulation of the plate connectors arranged in various planes, which preferably occurs with intervening insulating plates that are shaped such that they completely cover the areas of the adjoining plate connectors overlapping one another in combination with the offset of the conductor fastening legs, the required high-voltage strength with differences in potential of more than 5 kV can be achieved given extreme space conditions.

As a result of a preferred embodiment wherein the base parts contain substantially radial middle sections that can be plugged onto fastening pins at the carrying ring and further contain transverse legs that angle off therefrom and embrace the shim pockets at the top and bottom, an extremely simple mountability is enabled wherein the logical structure also can be immediately recognized and, thus, easily adhered to. The current-carrying capability of the conductors can be adequately dimensioned since plate connectors that are correspondingly broad and thick can be arranged in the individual planes. Over and above this, simple formation of the conductor loops also derives; i.e., the arrangement and sequence of the contacting and, finally, the other geometrical boundary conditions (such as, for example, keeping the shim pockets free) can be unproblematically assured. Finally, the inventive multi-layer connecting technology offers full flexibility in the layer arrangement in the primary and secondary planes, i.e., line crossings also can be implemented without further ado. The contradictory nature of some of the criteria, particularly of the current-carrying capability with a great detail of conductor material and optimally little voltage spacing and the dielectric strength wherein the situation should be reversed, can be bridged very well given the inventive connector technology.

For simplifying the fastening of the conductor ends, plug-in recesses formed according to the cross section of these conductor ends can be provided in the conductor fastening legs. The conductor ends are thereby preferably pulled toward the outside in their winding plane, are plugged into the recesses arranged in the corresponding radial position and are soldered in. What this, in turn, yields is that the recesses of the conductor fastening legs are arranged radially offset in the primary and secondary planes according to the radial spacing of the saddle coils for generating the gradient field for the X-direction and the Y-direction.

For reducing the overall thickness of the inventive multi-layer connection technology, at least two spaced plate connectors can be arranged in each plane. As warranted, particularly for the connection of conductor ends in the middle of the segment between two shim pocket center planes respectively bridged by a multi-layer connector packet, three or more plate connectors also can be provided in one plane.

Additional features and advantages of the present invention are described in, and will be apparent from, the Detailed Description of the Preferred Embodiments and the Drawings.

DESCRIPTION OF THE DRAWINGS

FIGS. 5 through 11 show partial cross-sectional views of the structure of the inventive multi-layer connection technology, wherein plate connectors are arranged in alternation in the various planes and the insulating plates are subsequently plugged on;

DETAILED DESCRIPTION OF THE PREFERRED EMBODIMENTS

Figure 1:
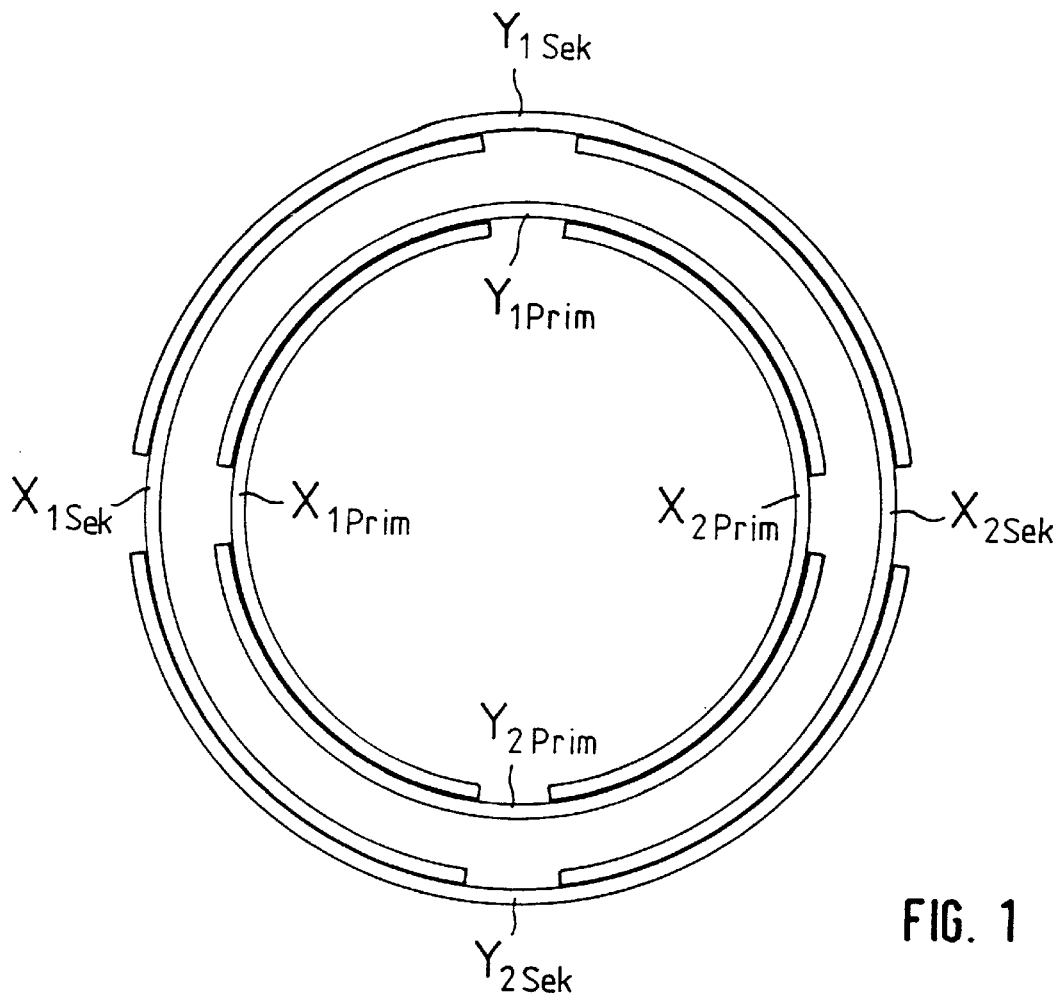
FIG. 1 is a cross-sectional view through an actively shielded gradient coil system formed in 3D technology having tesseral gradient coils for generating the gradient fields in the X-direction and Y-direction.

In FIG. 1, the saddle coils $X_{1prim.}$ and $X_{2prim.}$ of the primary plane and $X_{1sec.}$ and $X_{2sec.}$ of the secondary plane are schematically shown in cross-sectional view, wherein the loops of the windings of the primary coils $X_{1prim.}$ and $X_{2prim.}$ open at the ends must be connected to the open ends of the coil windings of the secondary plane $X_{1sec.}$ and $X_{2sec.}$ by connectors that are not shown in FIG. 1. The analogous case applies to the tesseral coils $Y_{2prim.}$, $Y_{2prim.}$ and $Y_{1sec.}$ and $Y_{2sec.}$ for generating the gradient field in the Y-direction that are offset by 90° relative to the coils for generating the gradient field in X-direction.

Figure 4:
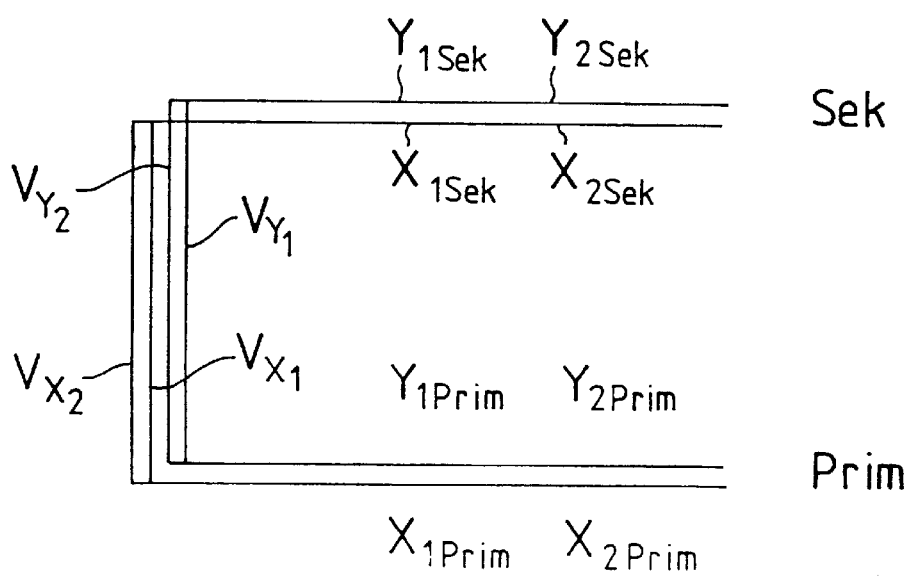
FIG. 4 is a schematic illustration of the connection technology of the coils of the primary plane and of the secondary plane.
Figure 2:
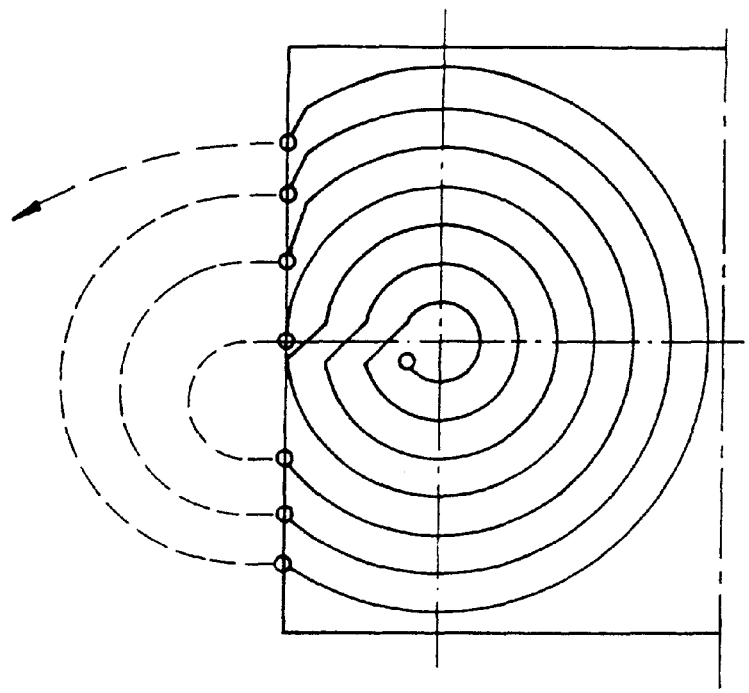
FIGS. 2 and 3 show simplified plan views of the winding structure of gradient coils for the 3D connection technology.
Figure 3:
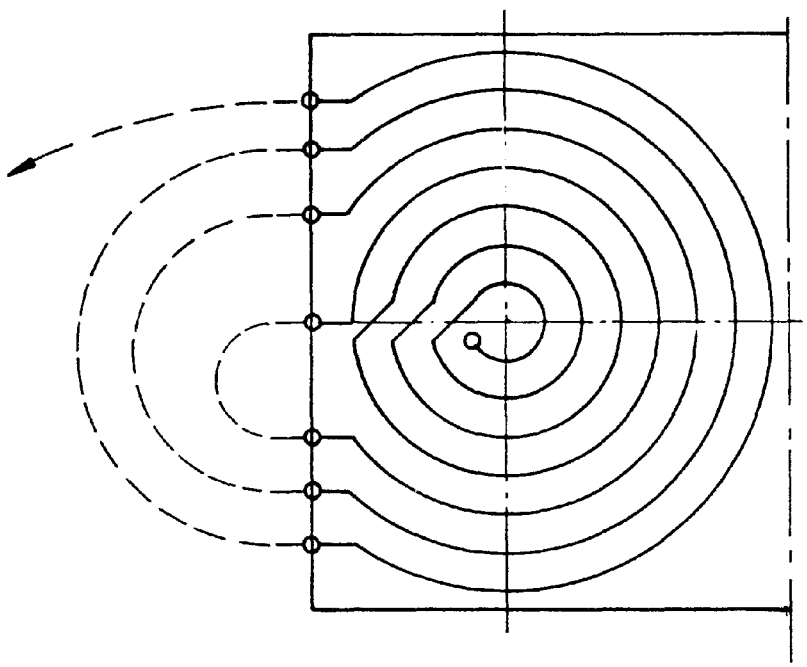

FIGS. 2 and 3 show highly simplified winding patterns of the tesseral gradient coils of such a 3D version, wherein the open conductor ends shown with solid lines of the winding pattern provided with an eye represent the coil arrangements of the primary plane and the conductor guidance shown with broken lines to the left thereof represent the winding technique in the appertaining secondary plane. The open coil ends of the windings in the primary and secondary plane that belong together, for example, the winding ends of the coil $X_{1prim.}$ and of the coil $X_{1sec.}$, are connected to one another in the type of interconnection shown in FIG. 4 by connectors $V_{X1}$, $V_{X2}$, $V_{Y1}$, $V_{Y2}$. The actual implementation of such a connection technology in a multi-layer connection technology as provided by the present invention is shown in FIGS. 5 through 12.

In FIGS. 5 through 11, a portion of a carrier ring 1 arranged in front of the end face of a gradient coil system is shown, for instance according to FIG. 1, wherein the recesses between the salient retention segments 2 corresponding to the width of the shim pockets 3—indicated with broken lines in some of the figures—of the finished gradient coil system. The carrier ring, thus lies radially directly within the shim pockets which in turn, lie exactly between the retention segments 2. FIG. 1 shows an exemplary embodiment wherein the windings of the gradient coils are formed such that respectively five connectors for the open conductor ends of primary and secondary coil for generating the gradient field in Y-direction and five connectors for the connection of conductor ends of the coils for generating the gradient field in X-direction are arranged between the center planes 4 of neighboring shim pockets 3. The connectors V are referenced with index $Y_1$, $Y_2$, $X_1$ and $X_2$, dependent on what connection of which coil ends they are conceived for.

Figure 5:
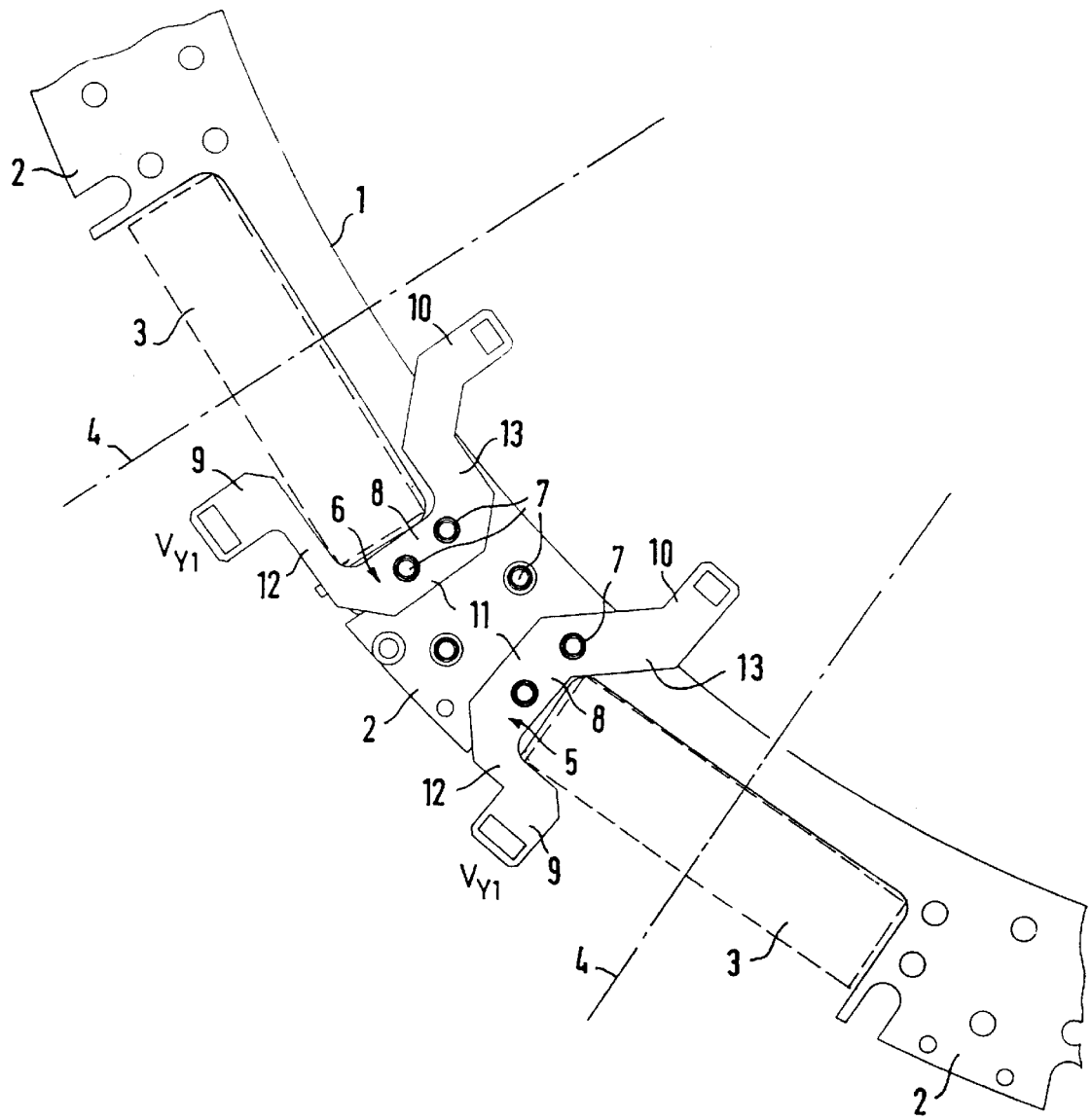
Figure 6:
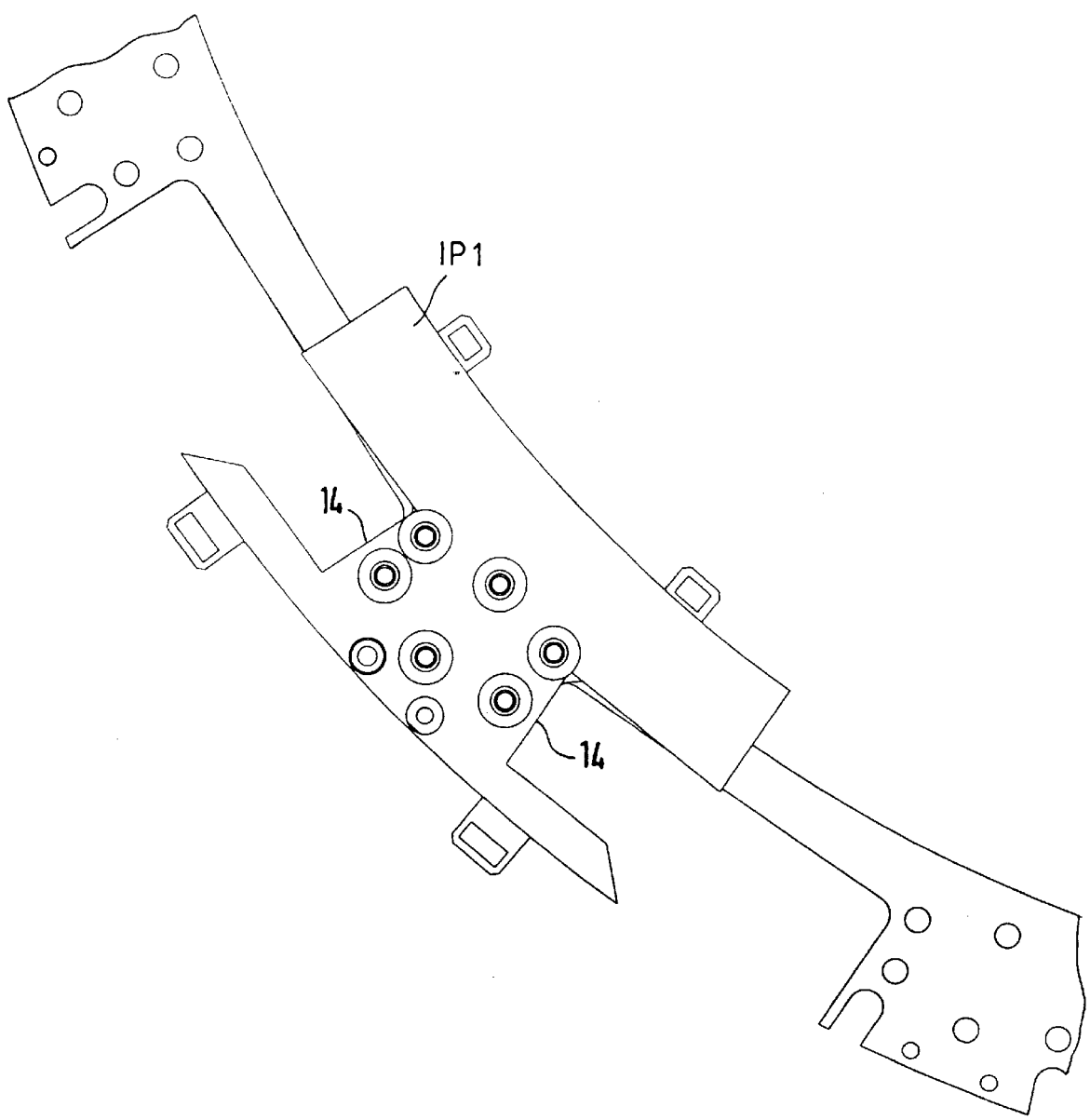
Figure 7:
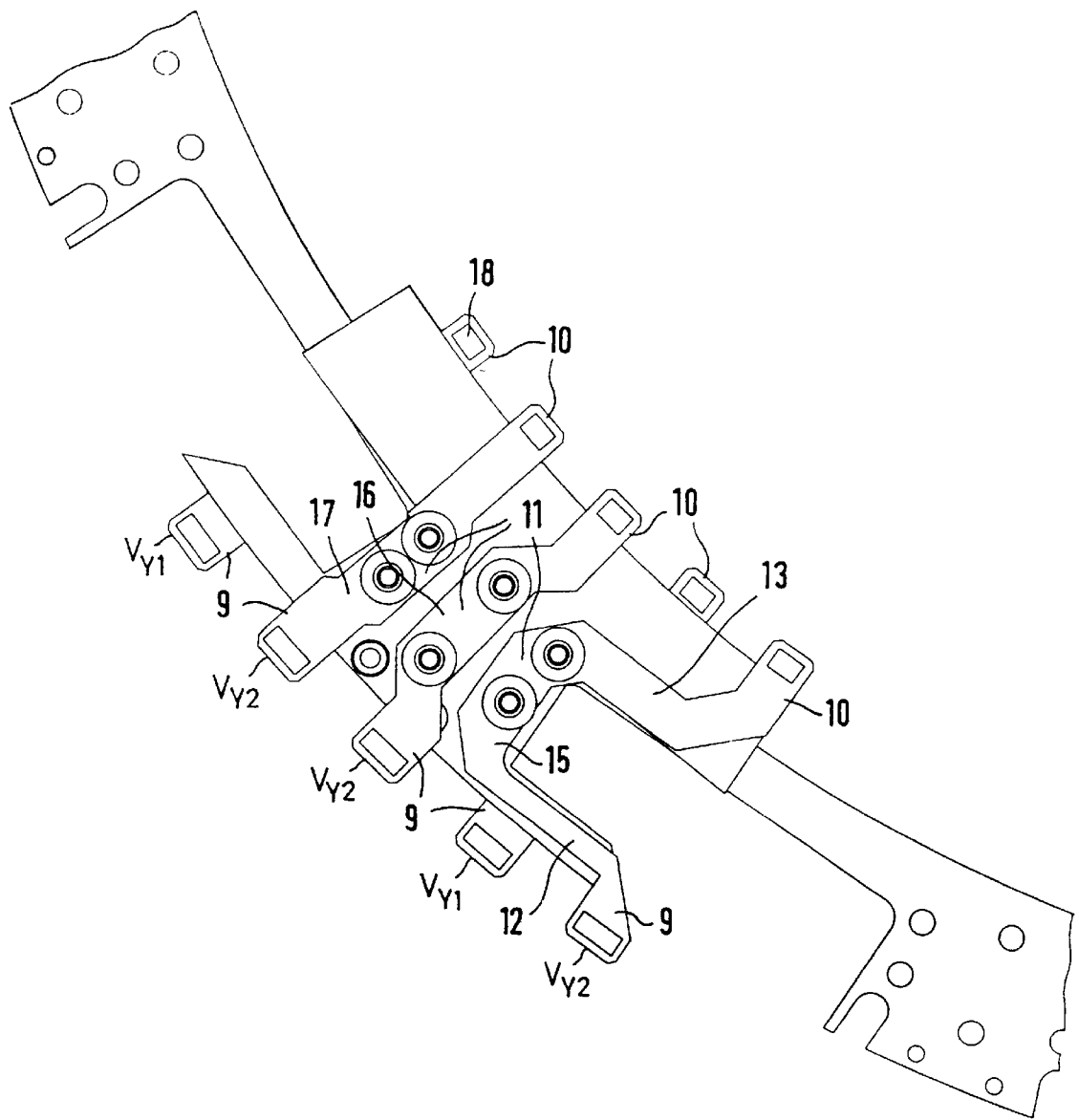

In FIG. 5, two plate connectors 5 and 6 are shown that are plugged, in spaced relationship from one another, onto respectively two of the six total pins 7 provided at the carrier section of the carrier ring 1; being plugged on in the first plane of the multi-layer connection technology. Each plate connector 5, 6 is thereby composed of a base part 8 lying completely outside the shim pockets and of conductor fastening legs 9, 10 projecting substantially radially outward therefrom. As such, base part 8 is, in turn, composed of a substantially radial center section 11, which is pluggable onto the fastening pins 7, and of transverse legs 12, 13 angled off therefrom that embrace the respective shim pocket 3 at the top and bottom. An insulating plate IP1 is subsequently plugged onto the plate connectors 5 and 6 according to FIG. 5, the insulating plate IP1 being formed such that it completely covers the mutually overlapping regions of the plate connectors in the first plane and of the second connector plane that is shown in FIG. 7 (yet to be described). This insulating plate IP1 is formed as a large-area plate that is laterally provided with recesses 14 that leave the shim pockets 3 free. As shown in FIG. 7, three further plate connectors 15, 16 and 17 are applied onto the insulating plate IP1 of FIG. 6 such that they, in turn, have their center sections 11 of the base parts plugged onto the pins 7. These plate connectors 15, 16 and 17 additionally identified with $V_{Y2}$ serve the purpose of connecting the open coil ends of the coils $Y_{2prim.}$ to those of the appertaining shielding coil $Y_{2sec.}$. The plug-in recesses 18 introduced into the conductor fastening legs 10 correspond to the cross section of the conductor ends to be plugged and soldered therein, as indicated with reference to the example in FIG. 12.

Figure 8:
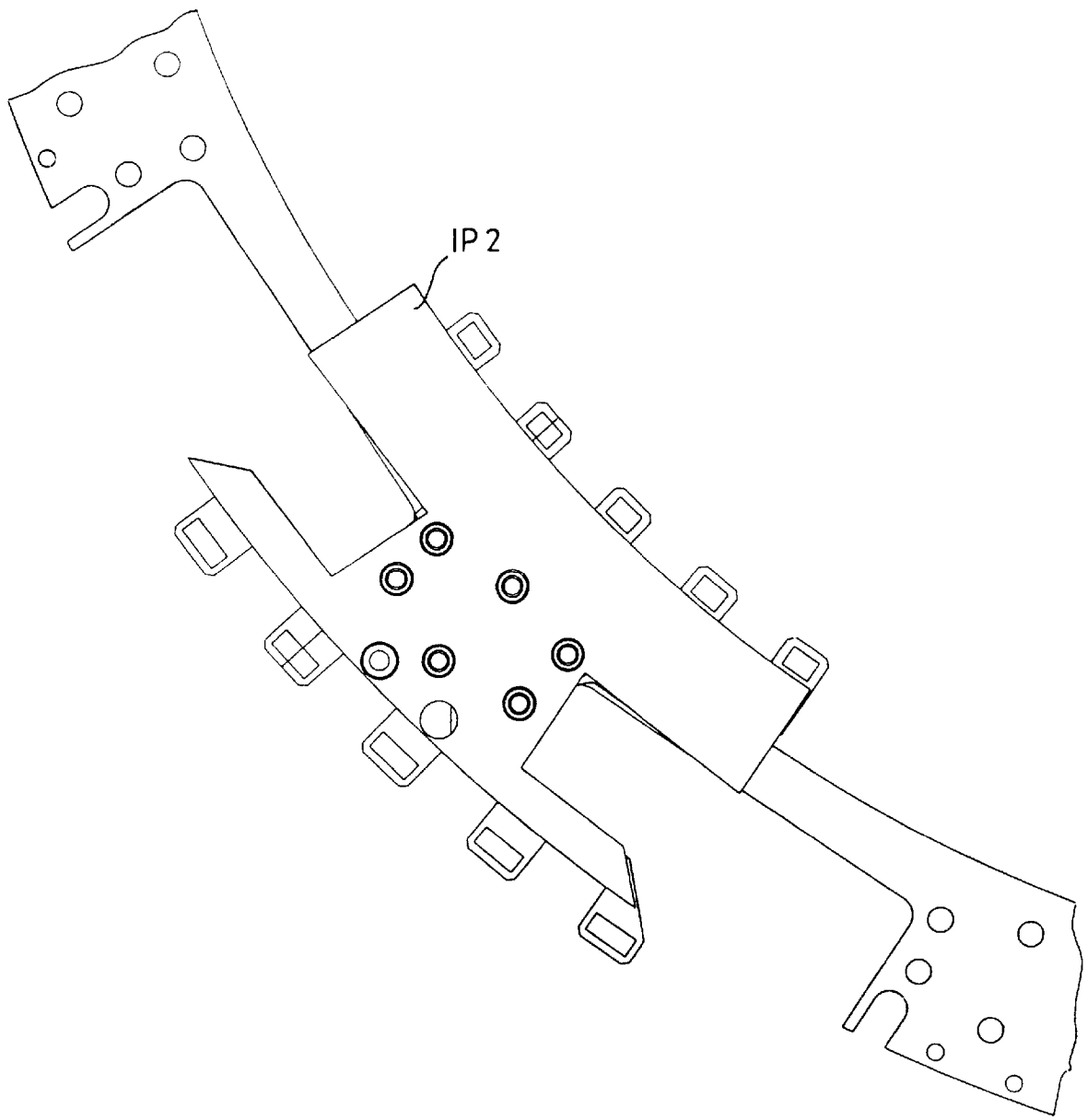
Figure 9:
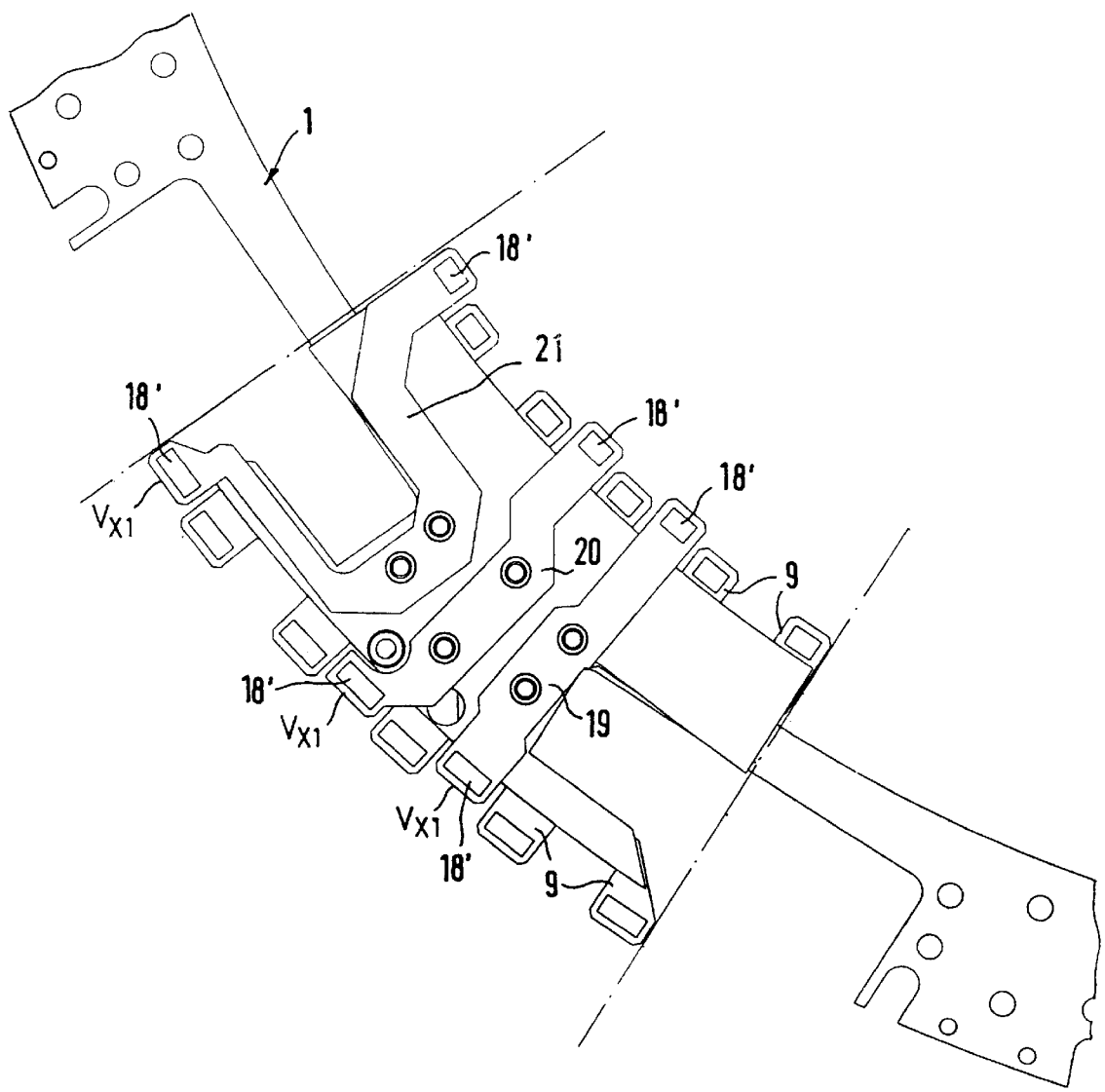
Figure 10:
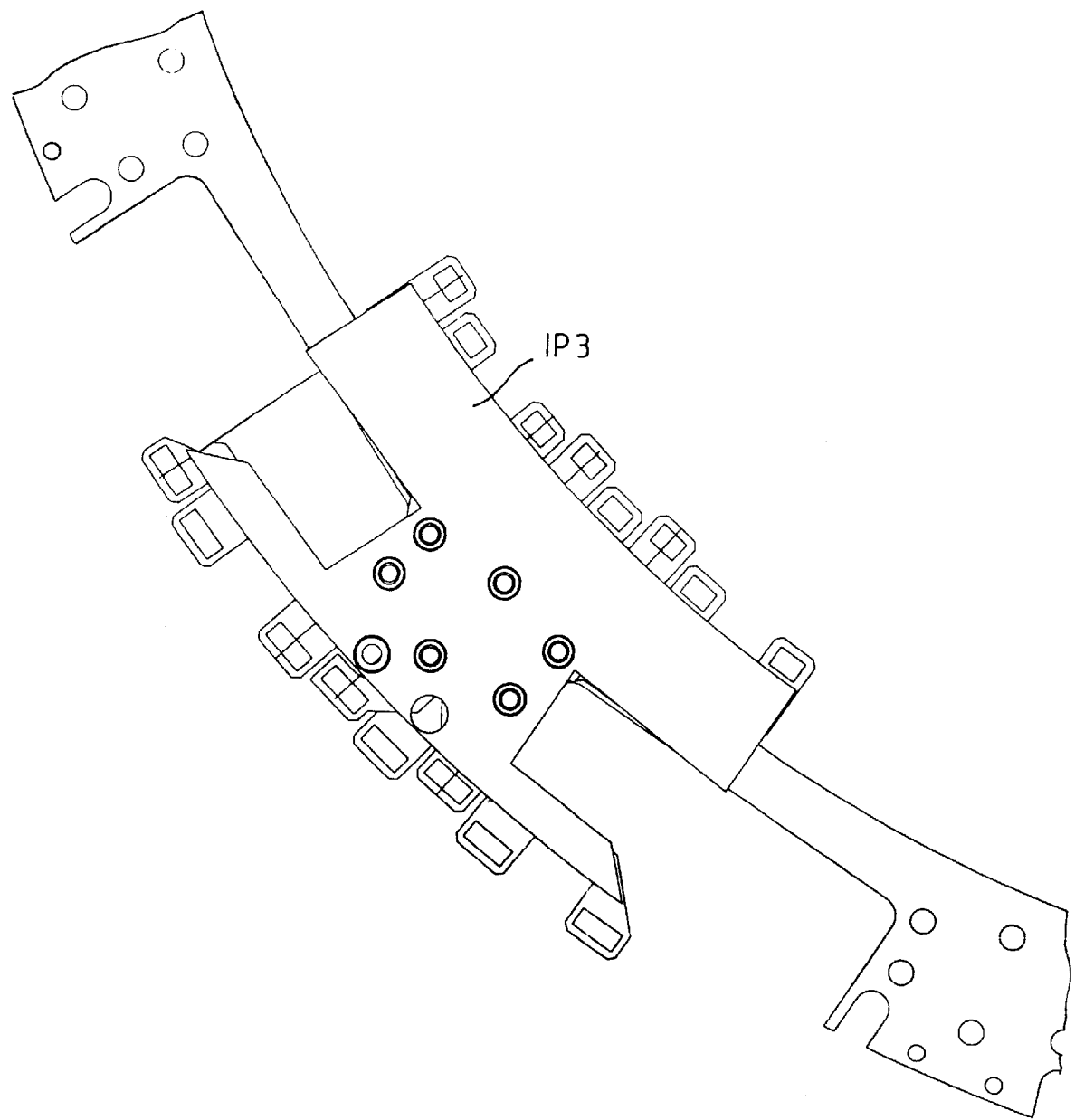
Figure 11:
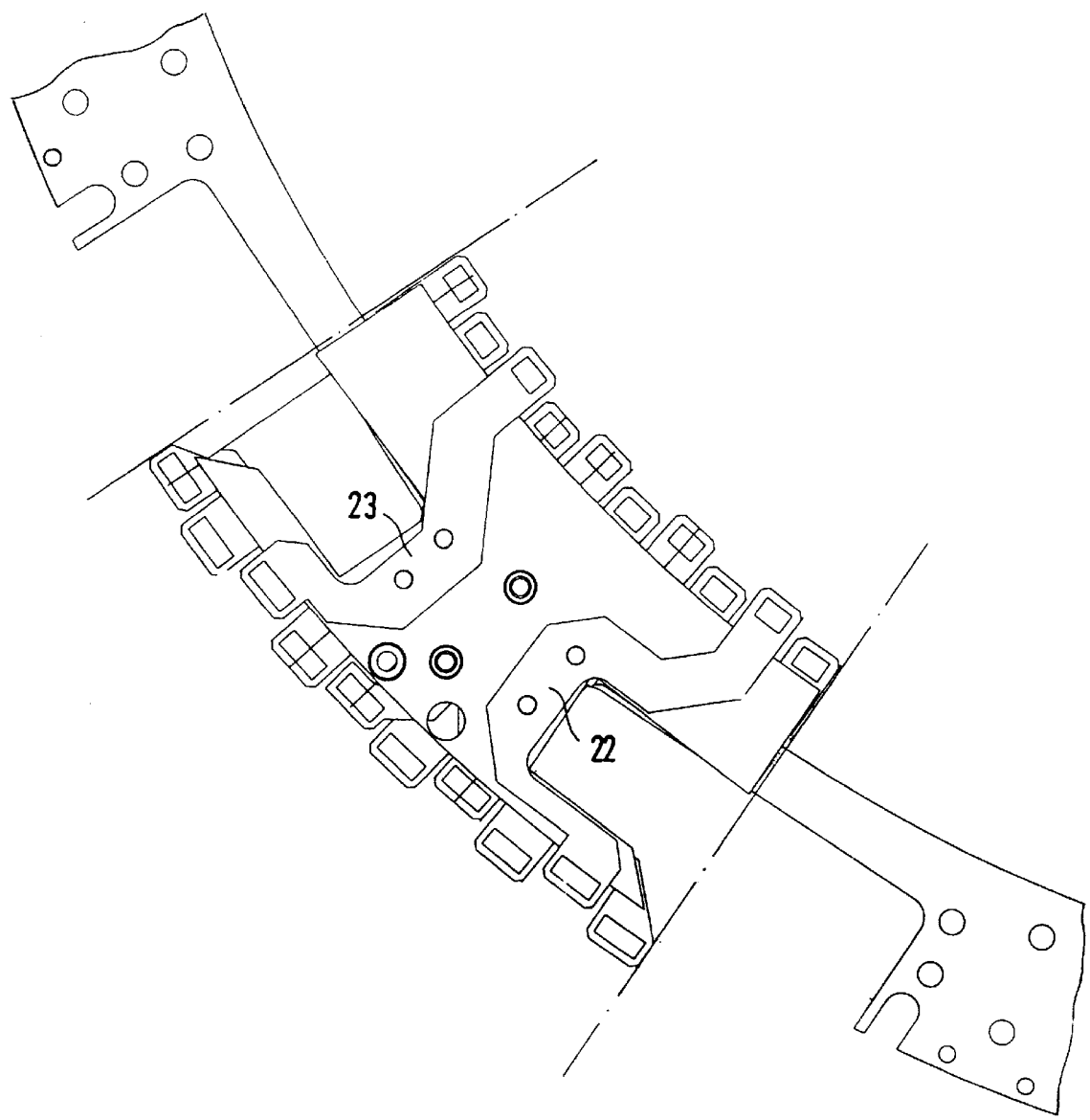
Figure 12:
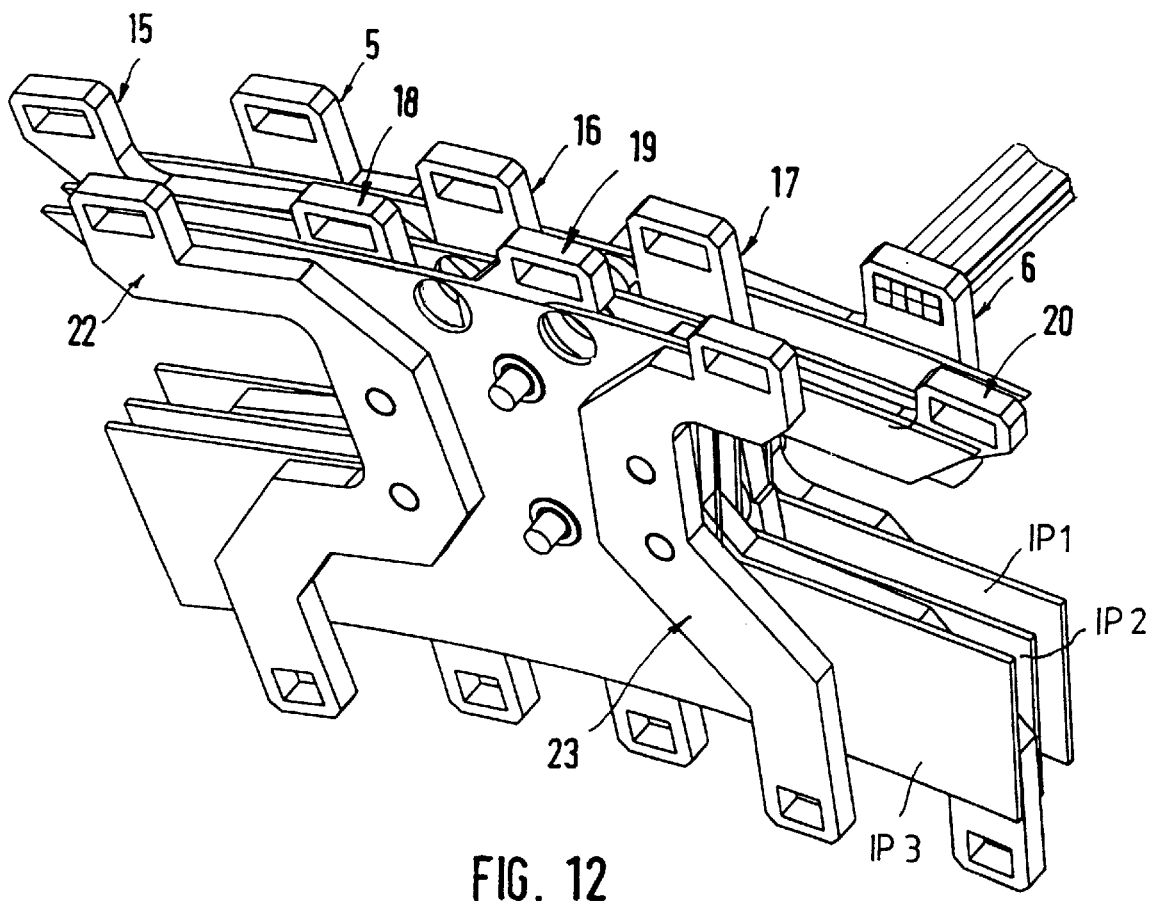
FIG. 12 shows a perspective view of the multi-layer connector structure given the superimposed layering of the plate connectors and insulating plates according to FIGS. 5 through 11.

After the second insulating plate IP2 FIG. 8) has been placed onto the plate connectors shown in FIG. 7, plate connectors 19, 20 and 21 are placed on (as shown in FIG. 9) for connecting the conductor ends of the coils for generating the gradient field in X-direction that lie open in the primary and secondary plane, and the respective, open conductor ends are thereby inserted into the plug-in recesses 18'. Due to the radial offset of the coils for the X-direction relative to those for the Y-direction, which can be seen best in FIG. 1, these plug-in recesses 18' for the connectors of the conductor ends of the coils $X_{1prim.}$ and $X_{1sec.}$ as well as $X_{2prim.}$ and $X_{2sec.}$ are correspondingly radially offset by this dimension relative to the recesses 18 of the connectors for the coils of the Y-direction. What is critical in the formation of the connectors 5, 6, 15, 16, 17 and 19, 20, 21 (the same also applying to the two other connectors 22 and 23 shown in FIG. 11) is to configure them such that the base part that is mostly U-shaped lies completely outside the shim pockets yet partially embraces them at the top and bottom, and that the radially outwardly projecting conductor fastening legs 19 are respectively offset such that, in the plan view onto the finished multi-layer connector element for the illustrated sector of a gradient coil system that can be seen in FIG. 11, all ten conductor fastening legs 9 are arranged offset interstitially relative to one another at both the inside and the outside of the carrier rings 1. Thus, they come to lie exactly where the respective, open conductor end of the gradient coil winding is located. Due to the inventive formation of the angled plate connectors, which are arranged in a plurality of planes and are insulated from one another by the insulating plates IP1, IP2 and IP3, a connection of the open conductor ends of the coils of a gradient coil system implemented in 3D technology can be achieved in a very simple way, wherein a mutual penetration can be realized without further ado on the basis of conductor crossings. The type of connection for the conductor ends with the 3D plate connectors in the illustrated exemplary embodiment on the basis of plugging the conductor ends into plug-in recesses 18, 18'. The associated soldering can, of course, be accomplished via some other technique, for example by soldering, welding, crimping or with a glued connection. Over and above this, the connectors can be combined with all possible conductors; i.e., the windings can be formed in solid wire, multiple wire or as stranded conductor.

Figure 13:
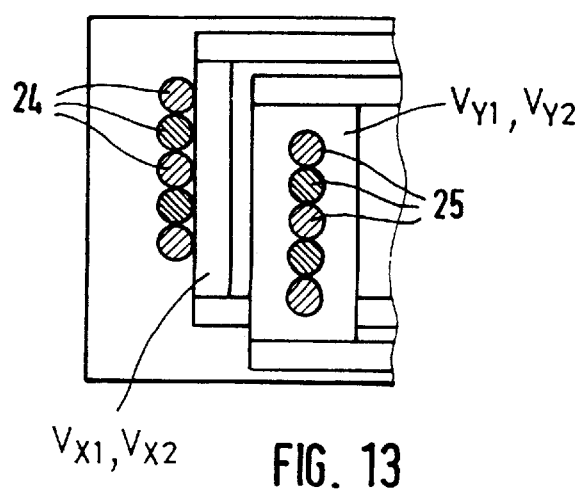
FIG. 13 is a schematic illustration of the connection technology similar to FIG. 4, wherein the connectors are provided with cooling devices in various ways.

FIG. 13 schematically shows a connector technique wherein the connectors $V_{X1}$, $V_{X2}$ are provided with externally disposed cooling coils 24, whereas the connectors $V_{Y1}$ and $V_{Y2}$ show the other possible type wherein the cooling coils 25 are internally integrated into the connectors. An effective cooling of the connectors that are often very highly stressed by the high currents can be achieved with the assistance of these cooling coils.

The inventive plate connectors arranged in multi-layer form can be cast out together with the gradient coil (for example, epoxy vacuum) or, on the other hand, can project out of the cast member.

Although the present invention has been described with reference to specific embodiments, those of skill in the rat will recognize that changes may be made thereto without departing from the spirit and scope of the invention as set forth in the hereafter appended claims.

We claim as our invention:

1. An actively shielded, transversal gradient coil system for a nuclear magnetic resonance tomography apparatus, the system comprising a plurality of saddle coils radially spaced from each other and arranged in both primary and secondary planes for respectively generating gradient fields in an X-direction and a Y-direction, the saddle coils having windings implemented in 3-D technology which include a plurality of open conductor ends wherein connector elements connect the conductor ends of the primary and secondary planes which belong to one another at an end face, and wherein the connector elements for connector ends discharging between center planes of neighboring shim pockets are formed as planar plate connectors arranged outwardly of the shim pockets in a plurality of planes insulated from one another, the planar plate connectors respectively including a base part secured to a carrier ring and a plurality of conductor fastening legs projecting substantially radially outward therefrom and arranged circumferentially offset with respect to one another in the planes lying above one another.

2. An actively shielded, transversal gradient coil system for a nuclear magnetic resonance tomography apparatus as claimed in claim 1, wherein each of the base parts includes a substantially radial middle section pluggable onto fastening pins of the carrier ring and further includes transverse legs angled off therefrom which embrace an adjacent shim pocket at a top and a bottom.

3. An actively shielded, transversal gradient coil system for a nuclear magnetic resonance tomography apparatus as claimed in claim 1, wherein the conductor fastening legs include plug-in recesses formed in accordance with a cross-section of the associated conductor ends.

4. An actively shielded, transversal gradient coil system for a nuclear magnetic resonance tomography apparatus as claimed in claim 1, further comprising a plurality of insulating plates arranged between the plate connectors of neighboring planes.

5. An actively shielded, transversal gradient coil system for a nuclear magnetic resonance tomography apparatus as claimed in claim 4, wherein the insulating plates are shaped such that they completely cover areas of the plate connectors which overlap one another.

6. An actively shielded, transversal gradient coil system for a nuclear magnetic resonance tomography apparatus as claimed in claim 3, wherein the plug in recesses are radially offset in the primary and secondary planes corresponding to the radial spacing of the saddle coils.

7. An actively shielded, transversal gradient coil system for a nuclear magnetic resonance tomography apparatus as claimed in claim 1, wherein at least two of the planar plate connectors are arranged in each plane.

8. An actively shielded, transversal gradient coil system for a nuclear magnetic resonance tomography apparatus as claimed in claim 1, further comprising a plurality of cooling devices allocated to the planar plate connectors.

9. An actively shielded, transversal gradient coil system for a nuclear magnetic resonance tomography apparatus as claimed in claim 8, wherein the plurality of cooling devices each include cooling coils adjacently positioned to the associated planar plate connector.

10. An actively shielded, transversal gradient coil system for a nuclear magnetic resonance tomography apparatus as claimed in claim 8, wherein the plurality of cooling devices each include cooling coils which internally penetrate the associated planar plate connector.

* * * * *